United States Patent [19]

Schneider

[11] Patent Number: 4,935,626

[45] Date of Patent: Jun. 19, 1990

[54] BROADBAND SUPERCONDUCTING DETECTOR HAVING A THERMALLY ISOLATED SENSING ELEMENT

[75] Inventor: Richard T. Schneider, Alachua, Fla.

[73] Assignee: Progress Technologies Corporation, St. Petersburg, Fla.

[21] Appl. No.: 243,684

[22] Filed: Sep. 13, 1988

Related U.S. Application Data

[63] Continuation-in-part of Ser. No. 137,137, Dec. 23, 1987.

[51] Int. Cl.⁵ .......................... H01L 39/00; G01J 5/10
[52] U.S. Cl. ................................. 250/336.2; 505/848; 505/849
[58] Field of Search ................ 250/336.2, 352, 370.15; 505/848, 849

[56] References Cited

U.S. PATENT DOCUMENTS

| 2,189,122 | 2/1940 | Andrews | 250/336.2 |
| 3,691,381 | 9/1972 | Kleppner | 250/336.2 |
| 4,037,102 | 7/1977 | Hoyle et al. | 250/336.1 |
| 4,464,065 | 8/1984 | Wolf et al. | 374/121 |

OTHER PUBLICATIONS

D. H. Andrews, W. F. Brucksch, Jr., W. T. Ziegler and E. R. Blanchard, "Attenuated Superconductors: I. For Measuring Infra-Red Radiation", *Review of Scientific Instruments*, vol. 13 (Jul. 1942), pp. 281–291.

*Primary Examiner*—Constantine Hannaher
*Attorney, Agent, or Firm*—Cushman, Darby & Cushman

[57] ABSTRACT

A broadband photon detector device that operates using a superconducting material is biased at the temperature where the material changes from a superconducting to a non-superconducting state. Photons that strike the material cause a temperature change and a measurable increase in resistivity of the material. Measuring the increase in resistivity allows the detection of the incident photons. This detector is very sensitive because superconducting leads are connected at one end to the superconducting material and at another end to a sensor that measures the changing resistivity, thereby limiting thermal conduction. Thermal conduction is further prevented in another embodiment in which a sensor is electrically and thermally isolated from the superconducting material. This sensor detects the change in resistivity of the superconducting material through detecting a change in an eddy current established in the superconducting material.

9 Claims, 3 Drawing Sheets

BROADBAND SUPERCONDUCTING DETECTOR HAVING A THERMALLY ISOLATED SENSING ELEMENT

This application is a continuation-in-part of U.S. application Ser. No. 07/137,131 filed Dec. 23, 1987 (now pending) entitled "BROADBAND SUPERCONDUCTING DETECTOR".

BACKGROUND OF THE INVENTION

1. Field of the Invention

This invention relates to a broadband superconducting detector that detects incident photons.

2. Background and Prior Art

Pyroelectric detectors detect the presence of photons over a broad band of the spectrum with a crystal having an electric dipole moment which varies as a function of the temperature of the crystal. When light is absorbed by the crystal, the temperature of the crystal is raised and the electric dipole moment varies. By detecting the variation, the incidence of photons can be detected.

However, the sensitivity of pyroelectric detectors is low since a large variation in temperature in necessary to cause a measurable change in the crystal's electric dipole moment.

SUMMARY OF THE INVENTION

In the present invention much more sensitive broadband detection of photons can be obtained by using a superconducting material that is temperature biased, preferably at the point at which the superconducting material changes from a superconducting state to a non-superconducting state. When a superconducting material is biased in this way, a very small increase in the temperature of the superconductor will cause a measurable increase in the resistivity of the superconducting material. By measuring the change in resistivity of the material when photons strike the material, the incidence of photons can be detected.

In one embodiment, a sensor such as a two or four point probe is used, as disclosed in the parent application. It has also been found advantageous to form the leads connected to the superconducting material using superconducting material. If the leads were formed of wires, as would be expected, the wires themselves can act as a heat sink, thereby lengthening the amount of time it takes to increase the temperature and obtain measurable resistance, which indicates the presence of incident photons. Making the leads out of a superconducting material therefore increases the sensitivity of the detector.

Another embodiment of the present invention uses a sensor that is thermally and electrically isolated from the superconducting material, thereby making this material even more sensitive than using the previously described two or four point probe with superconducting leads as a sensor. This sensor is a coil loop that surrounds an individual superconducting detector. This coil is used along with a pulse generator to sensitize the superconducting material by inducing an eddy current in the superconducting material. This eddy current will not decrease until incident photons strike the superconducting material to cause a temperature increase and a change from the superconducting state to the non-superconducting state and, therefore, a resistance that will result in the eddy current decreasing. A decrease in the eddy current will cause a changing magnetic field and induce a voltage pulse in the sensing coil. This voltage pulse can then be detected by a pulse detector to indicate the incidence of photons.

This embodiment is particularly useful for an application in which the light pulses striking the superconducting material can be anticipated, such as with laser radar returns. Another advantage of this embodiment is that if the superconducting material is not sensitized, it is blind and does not contribute to the signal to noise ratio and cannot cause false returns.

Use of the superconducting material in this manner to detect photons greatly increases the sensitivity at which photon detection is possible.

BRIEF DESCRIPTION OF THE DRAWINGS

These and other advantages of the present invention may be appreciated from studying the following detailed description of the preferred embodiment together with the drawings in which.

DETAILED DESCRIPTION OF THE PREFERRED EMBODIMENT

Figure 1:
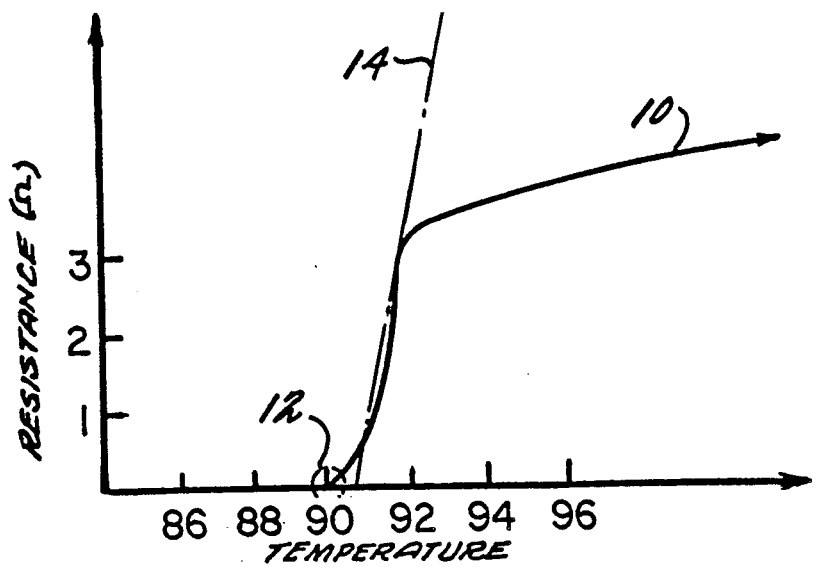
FIG. 1 is a graph showing the relationship of temperature and resistance of a typical superconducting material at and above the transition temperature range where the superconducting material changes from a superconducting state to a non-superconducting state.

FIG. 1 illustrates the relationship between temperature and resistance for the transition range of the superconducting material $YBa_2Cu_3O_7$. Other superconducting materials such as $La_2CuO_4$, $Sr_2CuO_4$, $Nb_3Ge$, among others can be used. The April 1987 issue of *Physics Today* shows on page 23 a chart of other superconducting materials which could be used. Even this chart is only illustrative. The 1987 special issue of *Advanced Ceramic Materials*, Vol. 2, No. 3B shows temperature-resistivity charts for these and other superconducting materials at pages 435, 436 489, 501 and 503. Initial processing of these materials is described at pages 273-281. These publications are hereby incorporated by reference.

A temperature-resistance relationship very similar to the relationship illustrated in FIG. 1 exists for all superconducting materials. Therefore, the term superconducting material will herein after be referred to rather than the elemental structure of the superconducting material being used.

Plot 10 in FIG. 1 illustrates that at a certain temperature, increasing the temperature further will cause a very substantial increase in resistance. The point at which increasing the temperature will cause resistance in the superconducting material is shown as working point 12 in FIG. 1. Biasing the superconductor material substantially at working point 12 enables the detection of incident photons.

The type and structure of the material used of course influences the sensitivity of the detector. The slope of segment 14 in FIG. 1, which extends through the transition range, can be varied by changing the grain size of the superconducting material. In general, the smaller the grain size of the superconducting material, the steeper the slope. Also, varying the composition of the superconducting material will change the sensitivity of the detector.

Figure 2A:
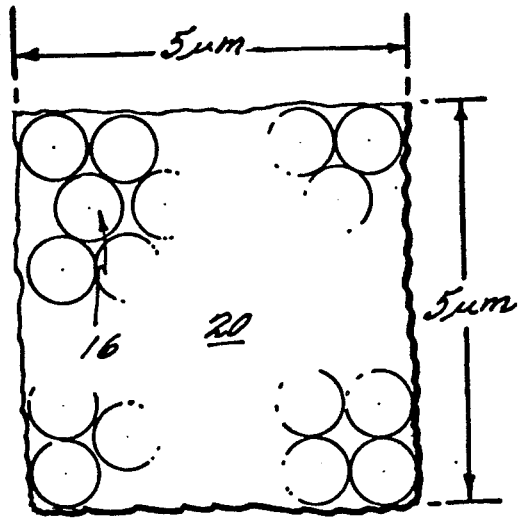
FIG. 2(a) illustrates an enlarged top view of a superconducting material used as a detector.

FIG. 2(a) illustrates a superconducting detector 20 which is made up of individual grains 16. In the preferred embodiment, each grain 16 is no larger than 1,000 angstrom units. A superconducting detector 20 which has individual grains 16 less than 1000 angstrom units in size can be obtained by pulverizing the superconducting material. After the material has been pulverized, the superconducting material is fired for two hours in an oven which reaches a temperature of 1000° K. Bringing the superconducting material to this temperature allows the superconducting material to be used as a detector until the temperature of the superconducting detector 20 reaches the temperature at which it was fired. Because the superconducting detector 20 will be used at a much lower temperature than 1000° K. when detecting photons, superconductor detector 20 is expected to have a relatively long life.

Figure 2B:
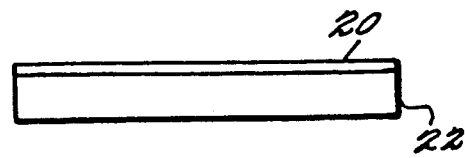
FIG. 2(b) is an enlarged side view of the superconducting material used as a detector mounted on a substrate.

FIG. 2(b) illustrates an elevational view of a plurality of individual grains 16 after they have been fired and mounted on a substrate 22 of either sapphire or quartz. The superconducting material on the substrate is then polished to a thickness of between 100–1000 angstrom units. Polishing the material down to a thickness of only to 100–1000 angstrom units also increases the sensitivity of the device because the grains near the surface receive almost all of incident radiation and therefore more individual grains will be used for actually detecting photons. The polished material and substrate can then be cut into individual detector elements 20, preferably 5 μm by 5 μm, by etching or laser trimming.

Figure 4:
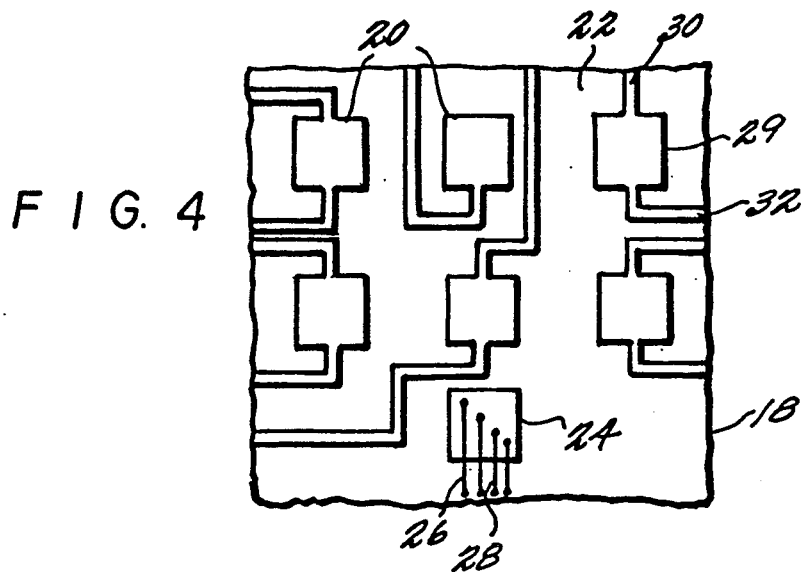
FIG. 4 is a partial top view of a detector chip.

FIG. 4 illustrates a section of detector chip 18. Detector chip 18 is composed of substrate 22 and a plurality of superconducting detectors 20. At least one superconducting detector 20 mounted on substrate 22 has a four point probe connected to the back surface of superconducting detector 20. A four point probe is shown as attached to detector 24 in FIG. 4. Outside wires 26 have their opposite ends each connected to a constant current source. Inside wires 28 are then connected to a potentiometer (not shown) which measures the voltage across the inner wires. The resistivity of the superconducting detector 20 can be very accurately determined using a four point probe.

Most of the superconducting detectors 20 on detector chip 18 are sensed using a two point probe. Detector 29, having a two point probe, is illustrated in FIG. 4 with wire pairs 30 and 32 attached at two points. One wire from each pair is then connected to a current source and the other wire from each pair is connected to a potentiometer. The voltage is then measured across the two points. Because the voltage is measured across the same points as the current is driven, this type of detector is not as accurate as detector 24 which uses the four point probe previously described. However, generally for detecting photons, it is accurate enough to make the required measurements.

It has also been found advantageous to make the leads extending from detectors 20 out of superconducting material.

Figure 5:
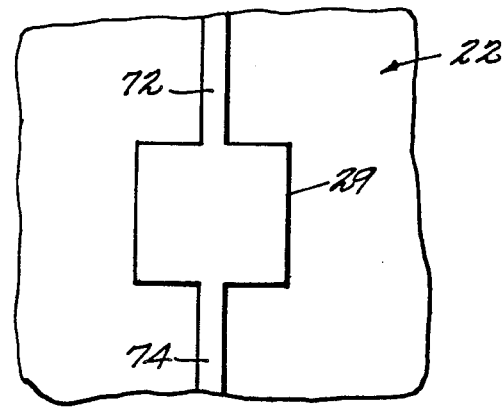
FIG. 5 shows a top view of an individual detector that has superconducting leads.

FIG. 5 shows a detector 29 that uses a two point probe as a sensor to determine the resistance and, therefore, the incidence of photons. In this embodiment, the wire pairs 30 and 32 of FIG. 4 are instead made of superconducting material, shown as leads 72 and 74. These leads can be formed on a substrate 22 using well known thin film processing techniques and, for a detector that is 5 μmX5 μm, the traces formed should be about 1 μm wide and have a thickness of 50–500 angstrom units. Superconducting leads 72 and 74 extend to the edge of the detector chip 18, from which point electrically conducting materials such as copper, silver, or aluminum can be used to connect the leads to the current source and potentiometer used in the two point probe.

If wire pairs 30 and 32 as shown in FIG. 4 were used and made of a conductor such as copper, silver, or aluminum because of their electrical conduction characteristics, they would also act as heat sinks and thermal conduction would take place. Although thermal conduction is much slower then electrical conduction, (approximately the speed of light versus the speed of sound), thermal conduction can influence sensitivity of the detector.

Furthermore, the cross sectional area of wire pairs 30 and 32 as shown in FIG. 4 must be larger than the cross sectional area of the leads 72 and 74 shown in FIG. 5 because ohmic losses result that do not occur in the superconducting leads 72 and 74. The greater cross sectional area results in greater thermal conduction. Therefore, using superconducting leads 72 and 74 further reduces cooling of detector 29 by heat conduction, which, in turn, increases the sensitivity of the detector 29.

Figure 3:
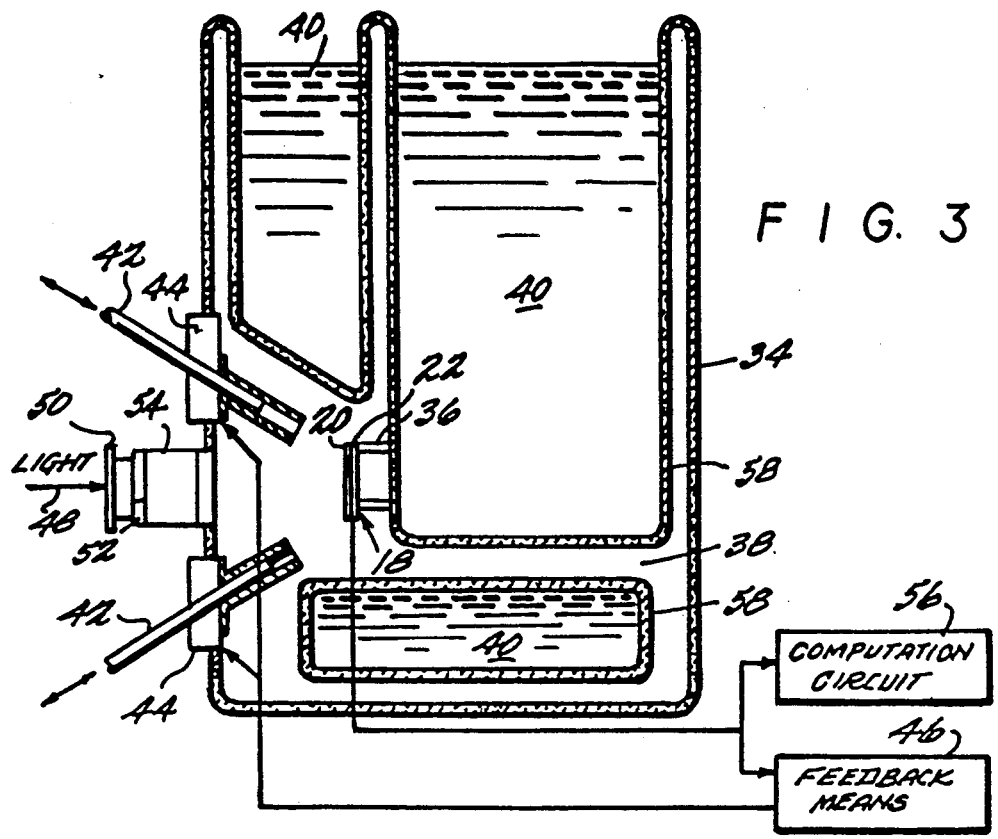
FIG. 3 is a side view of an apparatus using the superconducting material in a device which detects photons.

FIG. 3 illustrates one embodiment of an apparatus for detecting photons using a superconducting material. The housing 34 houses most of the structure. Detector chip 18, which includes a plurality of superconducting detectors 20 mounted on substrate 22, are attached to housing 34 with brackets 36. Detector chip 18 is mounted in a chamber 38 which can be filled with liquid nitrogen.

When chamber 38 is filled with liquid nitrogen, it brings the temperature of superconducting detectors 20 to 77° K. After superconducting detectors 20 reach a temperature of 77° K., the liquid nitrogen within chamber 38 is allowed to evaporate. Liquid nitrogen in chambers 40 is kept in these chambers 40 throughout operation of the superconducting broadband detector. After the liquid nitrogen in chamber 38 is removed, the liquid nitrogen in chambers 40 maintains the temperature of superconducting detectors 20 at about 77° K.

Infrared illuminators 42 are used to increase the temperature of the superconducting detectors 20 to the temperature of the working point (shown for $YBa_2Cu_3O_7$ as working point 12 in FIG. 1) and stabilize the temperature at the working point.

Infrared illuminators 42 are copper cylinders which hold a calcium fluoride lens and which are directed at detector chip 18. Moving infrared illuminators 42 toward or away from detector chip 18 decreases or increases, respectively, the effective field of view which irradiates detector chip 18. Infrared illuminators 42 are moved by servo motors 44 controlled by conventional feedback circuit 46. Feedback circuit 46 receives a very accurate resistance measurement from the four point probe on a detector such as detector 24 illustrated in FIG. 4. This measurement is used by feedback circuit 46 to determine whether infrared illuminators 42 should be moved toward or away from detector chip 18. When the correct working point is reached, infrared illuminators 42 are then in their correct position and servo motors 42 and feedback circuit 46 are turned off.

The illumination from infrared illuminators 42 counteract the cooling effect of the liquid nitrogen in chambers 40 to keep the detector chip 18 in a temperature equilibrium at the working point. Therefore, photons which strike the superconducting detectors 20 on detector chip 18 after the working point is established will be the only cause of a temperature increase in superconducting detectors 20.

To establish an accurate working point, shutter 50 is placed over window 52. Window 52 allows incident light 48 to strike detector chip 18 when the broadband superconducting detector is operating. When the broadband superconducting detector is ready for use, shutter 50 is removed from window 52 and incident light 48 travels through window 52 and strikes detector chip 18. Window 52 is constructed using two window panes which form a vacuum 54 between them so that condensation does not develop on the window 52 due to the low temperature of the liquid nitrogen contained within housing 34.

As photons of incident light 48 strike superconducting detectors 20, the temperature rises and resistance of superconducting detectors 20 correspondingly increases. This increase in resistance is detected by two point probes illustrated on superconducting detectors 20 such as detector 24 of FIG. 4. The measured voltage and known current values are then sent to computation circuit 56 to determine the resistivity of superconducting detectors 20. Once the resistivity of superconducting detectors 20 is determined, the presence of incident photons can also be determined by computation circuit 56.

Once a certain number of photons have been detected, superconducting detectors 20 will be at a temperature that is greater than the working point. Therefore, in order to use the device again, the temperature of superconducting detectors 20 must be brought back down to the working point. This can be done by refilling chamber 38 and determining the working point once again as earlier described. However, if the wavelength of the photons detected by the superconducting detectors 20 have a wavelength less than the thickness of the detector chip, the liquid nitrogen in chambers 40 will quickly cool down the superconducting detectors 20 to the working point because of blackbody radiation.

Figure 6:
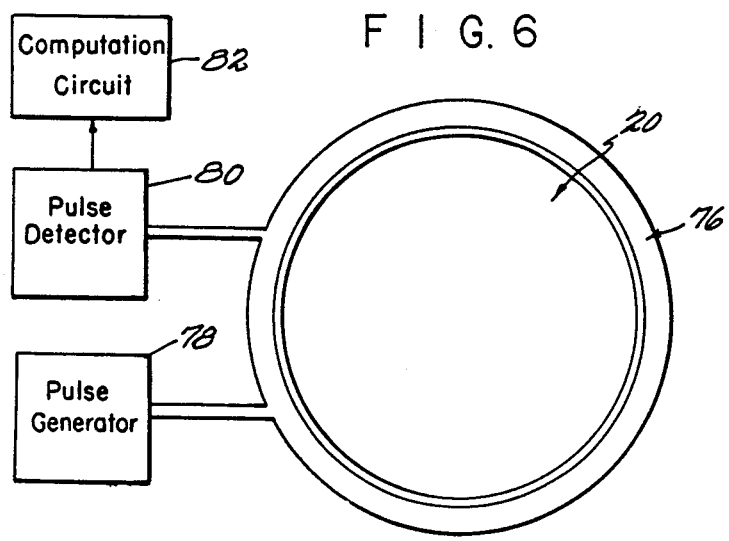
FIG. 6 shows a top view of a sensor of another embodiment used with an individual detector.

FIG. 6 shows another embodiment of the present invention that uses a sensor that operates differently from the two point probe or four point probe previously discussed. This sensor, which includes a sensing coil 76, has the advantage that the sensing coil 76 is thermally and electrically isolated from detector 20. As shown in FIG. 6, detector 20 is shaped so that it has a diameter of 5 μm. Sensing coil 76 is made of electrically conductive material such as copper, silver, or aluminum and has a diameter larger than 5 μm so that the inside edge of the sensing coil 76 does not touch detector 20. Because sensing coil 76 does not touch detector 20, it is thermally and electrically insulated from detector 20. This prevents the sensing coil 76 from acting as a heat sink and makes the detector 20 even more sensitive. The shape of detector 20 and sensing coil 76 can have a geometry other than the circular geometry shown, for example, a rectangular shape.

Attached to sensing coil 76 is a pulse generator 78 and a pulse detector 80. Pulse generator 78 emits a one amp pulse for approximately 1-100 μs to sensing coil 76, which causes the generation of an eddy current in detector 20. Because detector 20 is in a superconducting state, no resistance is present and the eddy current will not deteriorate until detector 20 is no longer in a superconducting state. This change in state will be caused by incident photons striking detector 20.

Once incident photons striking detector 20 cause a change to a non-superconducting state, the eddy current will deteriorate and its magnetic field will decrease. This decreasing magnetic field will induce a pulse in sensing coil 76. This voltage pulse can then be detected by pulse detector 80. Voltage pulses caused by many detectors 20 can then be input to a computation circuit 82. Pulse detector 80 and circuit 82 perform the equivalent function of the two point probe and computation circuit 56 as shown in and described with reference to FIG. 3. The voltage pulse can be amplified before detection if necessary.

Once a voltage pulse has been detected, detector 20 must be cooled to superconducting state and resensitized using pulse generator 78 so that incident photons can be detected in the manner previously described.

While the invention has been described in connection with what is presently considered to be most practical and preferred embodiments, it is to be understood that the invention is not limited to the disclosed embodiment but is intended to cover various modifications and equivalent arrangements included within the spirit and scope of the appended claims. For example, other means can be used to keep the superconducting detectors 20 at the working point 12 indicated in FIG. 1. Also, the working point 12 indicated on FIG. 1 will vary with the different superconducting material being used to make the broadband superconducting detector. Therefore, persons of ordinary skill in this field are to understand that all such equivalent structures are to be included within the scope of the following claims.

What is claimed is:

1. A broadband photon detector comprising:
   detector means for detecting photons made from superconducting material such that at least within a given range incident photons increase the temperature of said material and the resistivity of said material varies in accordance with the temperature of said material;
   means for maintaining said material at a temperature within said given range so that an increase in temperature of said material will cause an increase in the resistivity of said material;
   means for sensing an increase in the resistivity of said material, said sensing means including:
      an electrically conductive coil disposed around said detector to be substantially thermally and electrically isolated from said detector;
      means for generating a pulse on said coil to cause an eddy current in said material; and
      pulse detecting means for detecting a voltage pulse caused by a changing magnetic field in response to said increase in resistivity of said material that causes a dissipation of said eddy current.

2. A detector according to claim 1 wherein said detector means and said coil are circular.

3. A detector according to claim 2 wherein said circular detector has a diameter of 5 μm.

4. A detector according to claim 2 wherein said sensing coil is made of copper, silver, or aluminum.

5. A detector according to claim 1 wherein said detector means and said coil are rectangular.

6. A detector according to claim 5 wherein said detector has an area that is 5 $\mu$m by 5 $\mu$m.

7. A detector according to claim 1 including a plurality of detector means and a plurality of sensing means mounted on a substrate.

8. A detector according to claim 1 wherein said generating means emits a 1 amp pulse for 1-100 $\mu$s.

9. A detector according to claim 1 wherein said coil has an inner edge that does not touch an outer edge of said detector.

* * * * *